(12) United States Patent
Hoebel et al.

(10) Patent No.: US 8,219,336 B2
(45) Date of Patent: Jul. 10, 2012

(54) ARRANGEMENT FOR DETERMINING THE OPERATIONAL PARAMETERS OF A HIGH-FREQUENCY POWER AMPLIFIER

(75) Inventors: Daniel Hoebel, Bad Woerishofen (DE); Hendrik Koehler, Hallbergmoos (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 703 days.

(21) Appl. No.: 12/307,509

(22) PCT Filed: Jun. 11, 2007

(86) PCT No.: PCT/EP2007/005133
§ 371 (c)(1),
(2), (4) Date: Jan. 5, 2009

(87) PCT Pub. No.: WO2008/003385
PCT Pub. Date: Jan. 10, 2008

(65) Prior Publication Data
US 2010/0274516 A1 Oct. 28, 2010

(30) Foreign Application Priority Data
Jul. 5, 2006 (DE) .......................... 10 2006 031 053

(51) Int. Cl.
*G01R 19/25* (2006.01)
*G06F 17/40* (2006.01)
(52) U.S. Cl. ................ 702/65; 702/64; 702/57; 702/60; 330/2
(58) Field of Classification Search .................... 702/65, 702/64, 60, 57
See application file for complete search history.

(56) References Cited

U.S. PATENT DOCUMENTS

| 5,208,550 | A | * | 5/1993 | Iwane | 330/129 |
| 5,564,086 | A | * | 10/1996 | Cygan et al. | 455/126 |
| 5,862,458 | A | * | 1/1999 | Ishii | 455/107 |
| 6,909,978 | B2 | * | 6/2005 | Bostoen et al. | 702/65 |
| 2003/0111997 | A1 | | 6/2003 | McMorrow | |
| 2005/0195919 | A1 | * | 9/2005 | Cova | 375/297 |

FOREIGN PATENT DOCUMENTS

| DE | 1 148 655 | 11/1963 |
| DE | 27 10 752 A1 | 9/1978 |

(Continued)

OTHER PUBLICATIONS

International Search Report, WO 2008/003385 A1, Rohde & Schwarz GmbH & Co. KG, Jan. 10, 2008, pp. 12-16.
International Preliminary Report on Patentability, PCT/EP2007/005133, Mar. 12, 2009, pp. 1-12.

(Continued)

*Primary Examiner* — Hal Wachsman
(74) *Attorney, Agent, or Firm* — Ditthavong Mori & Steiner, P.C.

(57) ABSTRACT

In order to determine various operational parameters of a power amplifier (for example, a complex load impedance or a complex forward and return power or a reflection factor or a voltage standing wave ratio) on a connecting line between an output of the power amplifier and a complex load, complex analog forward and return voltages on the connecting line are determined by an analog coupling device. These analog voltages are digitized and converted down into a baseband by one or more digital down-converters. From these digital values corresponding in absolute value and phase to the complex forward and return voltages and present in the baseband, desired operational parameters may then be calculated by a computer.

20 Claims, 1 Drawing Sheet

FOREIGN PATENT DOCUMENTS

| | | |
|---|---|---|
| EP | 0 401 545 A1 | 12/1992 |
| EP | 0 753 876 B1 | 1/1997 |
| EP | 1 732 231 A2 | 6/2006 |
| EP | 1732231 A2 | 12/2006 |
| JP | 2006258763 A | 9/2006 |

OTHER PUBLICATIONS

Bai Yanhong, Wang Jun, Zhou Ning, Application of Digital Down-converter in IF Digital Receiver Electronic Component & Device Application, Apr. 2004, p. 28-30, vol. 6 No. 4 (See English Abstract).

* cited by examiner

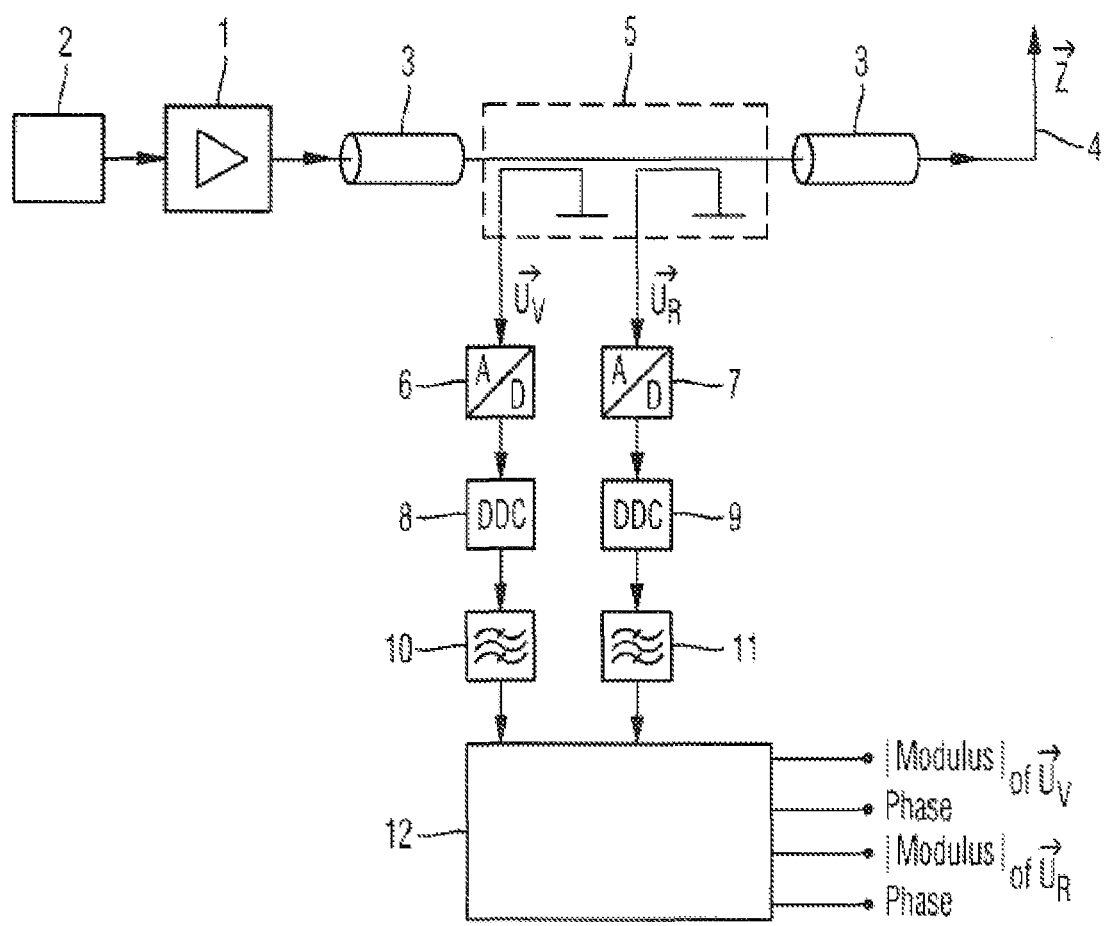

ARRANGEMENT FOR DETERMINING THE OPERATIONAL PARAMETERS OF A HIGH-FREQUENCY POWER AMPLIFIER

CROSS-REFERENCE TO RELATED APPLICATIONS

The present application claims priority to German Patent Application No. DE 10 2006 031 053.5, filed on Jul. 5, 2006, and is a national filing of PCT Application No. PCT/EP2007/005133, filed on Jun. 11, 2007, the entire contents of which are herein incorporated by reference.

BACKGROUND INFORMATION

1. Field of the Invention

The invention, according to various exemplary embodiments, relates to high-frequency power amplifiers and operational parameters thereof.

2. Discussion of the Background

In the operation of high-frequency power amplifiers, for example, a transistor power output stage of a variable-frequency shortwave transmitter, it is necessary to measure various operational parameters at an output of the power amplifier. For this purpose, the measurement on a connecting line between the output of the power amplifier and a complex load such as an antenna, for example, by one or more directional couplers, of a forward voltage proportional to a forward wave and a return voltage corresponding to a returning, reflected wave, by one or more directional couplers, is known from DE 27 10 752 A1 and respectively DE 39 18 159 A1. From these analog voltages measured in a high-frequency (HF) position, a required operational parameter of the amplifier is then calculated generally with an analog circuit. One disadvantage of the known arrangements is that, as a result of the determination of the measured values at the HF level, the calculations are relatively costly and complex, even if these calculations are implemented digitally.

DISCLOSURE

An object, according to various exemplary embodiments, is to simplify an arrangement of the aforementioned kind with regard to its realization in circuit technology.

According to various exemplary embodiments, forward and return voltages on a connecting line between a power amplifier and a load, in each case determined and digitized separately, are converted down through one or more digital down-converters into a baseband, that is to say, to a carrier frequency of 0 Hz. As a result, a sampling rate is reduced, and subsequent calculation of various operational parameters by a computer is considerably simplified. Moreover, a better resolution may be achieved. Separate determination of the forward and respectively return voltages on the connecting line may be implemented in any suitable, known manner, for example, by one or more directional couplers. According to certain other embodiments, these separate determinations are made by an arrangement, which allows each of the separate determinations of the forward and return voltages in digital form to be acquired by computational means, and which then only need to be converted down from a high-frequency position into a baseband position. A selection filter may be optionally provided between the digital down-converter and the computing unit.

An arrangement according to various exemplary embodiments, may determine, from the absolute value (modulus) and phase of the forward voltage and the absolute value and phase of the return voltage, the various desired or required operational parameters of the amplifier, such as the complex forward and return power, the complex load impedance of the antenna, the reflection factor and the voltage standing wave ratio, on the connecting line between the output of the high-frequency power amplifier and the antenna, which may be generally formed as a coaxial line. In this manner, these operational parameters can be calculated at low computational cost in a computer using appropriate, known algorithms.

Accordingly, not only may the operational parameters of a high-frequency power amplifier mentioned above by way of example be determined, but other calculations, which are useful for operation of the power amplifier, may also be implemented using appropriate, known algorithms with digital values made available to the computer. For example, digital demodulation by a known algorithm is possible and, in fact, according to a demodulation mode, which corresponds to a modulation mode for generation of the high-frequency signal amplified via the power amplifier, for example, according to amplitude modulation, frequency modulation or phase modulation or any other higher-value type of modulation required.

The useful signal at the output of the power amplifier digitally demodulated in this manner can be fed back to the input of a radio system for evaluation of the output signal and made audible there, for example, by means of a monitoring loudspeaker. In this manner, a "so-called" side-tone signal can be generated, with which the speaking comfort, for example, of a shortwave radio-telephony system can be monitored and improved. This possibility of feeding back speech is superior to the previously-used, direct feedback after the microphone amplifier to a monitoring loudspeaker, because all of the stages of the radio system including the output amplifier are also evaluated. This possibility of demodulation of the useful signal directly at the base of the antenna can also be used advantageously for monitoring in CW mode or respectively in the transmission of digital signals.

Another possibility is to determine, from the digital values supplied to the computer, which correspond to the complex forward voltage, one or more distortions of the output stage caused by non-linearity. Accordingly, the useful signal supplied to the power amplifier can be pre-distorted in any suitable, known manner before amplification in an opposite direction to the distortion, so that the distortions in the power amplifier may be compensated. This determination of the distortion in the output stage can also be monitored constantly during operation, so that, for example, even with a change of load, the connection of another antenna, or in the case of a frequency change, the system is automatically linearized via a corresponding change of the pre-distortion.

Any conventional signal processor or, for special tasks, a so-called field-programmable gate array (FPGA), with which the above-described digital calculations can be made at low cost, for example, according to the so-called Cordic algorithm, is suitable as the computer.

BRIEF DESCRIPTION OF THE DRAWINGS

Various exemplary embodiments are explained in greater detail by way of example, and not by way of limitation, in the FIGURE of the accompanying schematic drawing and exemplary calculation formulae. The drawing is as follows:

FIG. 1 is an outline circuit diagram of a shortwave power output stage of a high-frequency power amplifier with further development, according to an exemplary embodiment.

DETAILED DESCRIPTION OF THE PREFERRED EMBODIMENTS

A preferred arrangement for determining various operational parameters of a high-frequency power amplifier are described. In the following description, for the purposes of explanation, numerous specific details are set forth in order to provide a thorough understanding of the preferred embodiments. It is apparent, however, that the preferred embodiments may be practiced without these specific details or with an equivalent arrangement. In other instances, well-known structures and devices are shown in block diagram form in order to avoid unnecessarily obscuring the preferred embodiments.

FIG. 1 is an outline circuit diagram of a shortwave power output stage of a high-frequency power amplifier 1, according to an exemplary embodiment. A useful signal to be amplified is supplied from a control and modulation device 2. An output of power amplifier 1 supplies an antenna 4 via a coaxial connecting line 3.

In exemplary embodiments, a coupling device 5, for example, a directional coupler, obtains a complex forward voltage $\vec{U}_V$ and a complex return voltage $\vec{U}_R$ reflected from antenna 4, which are digitized in analog/digital converters 6, 7. These separately-obtained digital forward and return voltages are converted down by digital down-converters (DDC) 8, 9 from a high-frequency level of the high-frequency signal into a baseband (e.g., 0 Hz). After passing through selection filters 10 and 11, the down converted forward and return voltages are further processed in a computer 12. These digital forward and return voltage values converted down into the baseband and supplied to the computer may still contain various phase information. In this manner, an extremely diverse range of complex parameters may be calculated from the down converted digital forward and return voltage values by computer 12. For example, a complex load impedance or one or more scattering parameters of antenna 4 may be determined.

Accordingly, the complex phase information may be obtained through simultaneous sampling and processing of the forward and return voltages in one or more of digital down-converters 8 and 9. Digital down-converters 8, 9 may consist, for example, of a mixer, which mixes the signal down to baseband, and an additional cascaded integrated comb (CIC) filter. Through the CIC filter, a sampling rate may be reduced from the high-frequency position to the baseband position. With additional filters 10 and 11, mirror and alias products can be suppressed. In this context, the phase information may also be preserved.

According to various exemplary embodiments, calculation of the operational parameters of amplifier 1 by computer 12, may be implemented according to any suitable, known formulae of line theory.

For example, the complex load impedance $\vec{Z}$ can be calculated from the complex forward-return voltage. Accordingly, with this known complex load impedance, for example, by adaptive insertion of 50 ohm line portions of different lengths between power amplifier 1 and antenna 4, a power consumption, inter-modulation and/or a harmonic spacing can be improved, since complex matching can be optimized through various inserted line portions in such a manner that power amplifier 1 is operated within an optimum matching range. In this manner, for example, a low-pass character can be generated and operated within a capacitive range, so that the harmonic spacing can be improved. Also, amplification can be optimized in such a manner that power amplifier 1 can be matched better to its scattering parameters. Accordingly, an efficiency of power amplifier 1 can be optimized via calculation of the complex load impedance.

According to equation (I) (see below), a complex forward power, or, according to equation (II), a return power may be calculated, wherein k is an empirically or computationally determined factor, which depends upon one or more characteristics of the coupling and overall structure of power amplifier 1. According to equation (III), a complex reflection factor $\vec{r}$ or according to equation (IV), a voltage standing wave ratio s(VSWR) may, for example, also be calculated.

$$\vec{P}_V = K \cdot \vec{U}_V \quad \text{(I);}$$

$$\vec{P}_R = K \cdot \vec{U}_R \quad \text{(II);}$$

$$\vec{r} = \vec{U}_R / \vec{U}_V \quad \text{(III); and}$$

$$\vec{s} = U_{max}/U_{min} = \vec{U}_V / \vec{U}_R \quad \text{(IV),}$$

where $\vec{U}_V$ = Complex forward voltage, and $\vec{U}_R$ = Complex return voltage.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements. For instance, and as described above, a digital demodulation of the useful signal may also be possible, as is determination of distortions of amplifier 1 and associated, possible linearization through corresponding pre-distortion of the input signal.

The invention claimed is:

1. An arrangement for determining operational parameters of a high-frequency power amplifier on a connecting line connecting between an output of the high-frequency power amplifier and a complex load, said arrangement comprising:
   a coupling device configured to obtain complex, analog forward and return voltages on the connecting line,
   wherein the complex, analog forward and return voltages are digitized to obtain digital values of the forward and return voltages that are converted down into a baseband by digital down-converters and are further processed by a computer, and
   wherein complex phase information is obtained through simultaneous sampling and processing of the forward and return voltages.

2. An arrangement according to claim 1, wherein selection filters are disposed respectively between the digital down-converters and the computer.

3. An arrangement according to claim 2, wherein a complex impedance of the complex load is calculated by the computer from the digital values.

4. An arrangement according to claim 2, wherein a complex forward and/or return power is determined by the computer from the digital values.

5. An arrangement according to claim 2, wherein a complex reflection factor is determined by the computer from the digital values.

6. An arrangement according to claim 2, wherein a voltage standing wave ratio is determined by the computer from the digital values.

7. An arrangement according to claim 2, wherein a high-frequency signal is digitally demodulated, from the digital values, by the computer according to a modulation mode used in generation of the high-frequency signal amplified via the high-frequency power amplifier.

8. An arrangement according to claim 2, wherein a distortion of the high-frequency power amplifier is determined from the digital values, and from this, a compensation of the distortion of a high-frequency signal to be amplified is then calculated by the computer.

9. An arrangement according to claim 1, wherein a complex impedance of the complex load is calculated by the computer from the digital values.

10. An arrangement according to claim 9, wherein a complex forward and/or return power is determined by the computer from the digital values.

11. An arrangement according to claim 9, wherein a complex reflection factor is determined by the computer from the digital values.

12. An arrangement according to claim 9, wherein a voltage standing wave ratio is determined by the computer from the digital values.

13. An arrangement according to claim 9, wherein a high-frequency signal is digitally demodulated, from the digital values, by the computer according to a modulation mode used in generation of the high-frequency signal amplified via the high-frequency power amplifier.

14. An arrangement according to claim 9, wherein a distortion of the high-frequency power amplifier is determined from the digital values, and from this, a compensation of the distortion of a high-frequency signal to be amplified is then calculated by the computer.

15. An arrangement according to claim 1, wherein a complex forward and/or return power is determined by the computer from the digital values.

16. An arrangement according to claim 1, wherein a complex reflection factor is determined by the computer from the digital values.

17. An arrangement according to claim 1, wherein a voltage standing wave ratio is determined by the computer from the digital values.

18. An arrangement according to claim 1, wherein a high-frequency signal is digitally demodulated, from the digital values, by the computer according to a modulation mode used in generation of the high-frequency signal amplified via the high-frequency power amplifier.

19. An arrangement according to claim 1, wherein a distortion of the high-frequency power amplifier is determined from the digital values, and from this, a compensation of the distortion of a high-frequency signal to be amplified is then calculated by the computer.

20. An arrangement according to claim 1, wherein the complex load relates to an antenna of the high-frequency power amplifier.

* * * * *